US011763855B2

(12) United States Patent
Narui

(10) Patent No.: US 11,763,855 B2
(45) Date of Patent: Sep. 19, 2023

(54) METHODS AND APPARATUSES FOR ALIGNING READ DATA IN A STACKED SEMICONDUCTOR DEVICE

(71) Applicant: MICRON TECHNOLOGY, INC., Boise, ID (US)

(72) Inventor: Seiji Narui, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/316,140

(22) Filed: May 10, 2021

(65) Prior Publication Data

US 2021/0264955 A1    Aug. 26, 2021

Related U.S. Application Data

(63) Continuation of application No. 15/938,819, filed on Mar. 28, 2018, now Pat. No. 11,004,475.

(51) Int. Cl.
| | |
|---|---|
| *G11C 5/02* | (2006.01) |
| *H01L 25/065* | (2023.01) |
| *G11C 5/04* | (2006.01) |
| *H10B 99/00* | (2023.01) |

(52) U.S. Cl.
CPC .............. *G11C 5/025* (2013.01); *G11C 5/04* (2013.01); *H01L 25/0657* (2013.01); *H10B 99/00* (2023.02); *H01L 2225/06541* (2013.01); *H01L 2225/06555* (2013.01)

(58) Field of Classification Search
CPC ....... H01L 2225/06541; H01L 25/0657; G11C 5/025; G11C 5/04
See application file for complete search history.

(56) References Cited

U.S. PATENT DOCUMENTS

| 9,003,221 B1 | 4/2015 | Abugharbieh et al. |
| 2010/0014364 A1 | 1/2010 | Laberge et al. |
| 2013/0208546 A1 | 8/2013 | Kim et al. |

(Continued)

FOREIGN PATENT DOCUMENTS

CN    102099861 A    6/2011

OTHER PUBLICATIONS

English translation of TW Office Action for Application No. 108110220, dated Nov. 19, 2019.

(Continued)

*Primary Examiner* — Ryan Johnson
*Assistant Examiner* — Colleen J O'Toole
(74) *Attorney, Agent, or Firm* — Dorsey & Whitney LLP

(57) ABSTRACT

Methods and apparatuses are provided for aligning read data in a stacked semiconductor device. An example apparatus includes a stacked semiconductor device comprising stacked first and second die. The stacked semiconductor device includes a first path having a first align (first die) and second align (second die) circuits for providing read data from the second die and a second path having a first replica align (first die) and second replica align (second die) circuits. During a timing align operation, a first control circuit sets the first align and replica align circuits to a first delay value based on a propagation delay of a clock signal through the second replica align circuit. After setting of the first delay value, a second control circuit sets the second align and replica align circuits to a second delay value based on a difference in propagation delays through the first and second replica align circuits.

20 Claims, 12 Drawing Sheets

(56) References Cited

U.S. PATENT DOCUMENTS

| | | |
|---|---|---|
| 2013/0315015 A1 | 11/2013 | Park et al. |
| 2013/0322173 A1 | 12/2013 | Gillingham et al. |
| 2014/0247683 A1 | 9/2014 | Riho |
| 2014/0285253 A1 | 9/2014 | Jeon et al. |
| 2015/0061721 A1 | 3/2015 | Jeong |

OTHER PUBLICATIONS

International Search Report and Written Opinion dated Jun. 18, 2019 for PCT Application No. PCT/US2019/020783, 13 pages.

METHODS AND APPARATUSES FOR ALIGNING READ DATA IN A STACKED SEMICONDUCTOR DEVICE

CROSS-REFERENCE TO RELATED APPLICATION

This application is a continuation of U.S. patent application Ser. No. 15/938,819, filed Mar. 28, 2018. This application is incorporated by reference herein in its entirety and for all purposes.

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking a plurality of memory core dies (or dice) vertically and interconnecting the dies using through-silicon (or through-substrate) vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC) and High Bandwidth Memory (HBM). However, in 3D memory devices, operation timing is sometimes different in each of the stacked core dies (chips) due to process variations, voltage variations, etc. Because conductive paths are shared among core chips in 3D memory devices, these variations may cause timing issues related to data transfer, such as two core chips transmitting data contemporaneously over the same conductive path.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
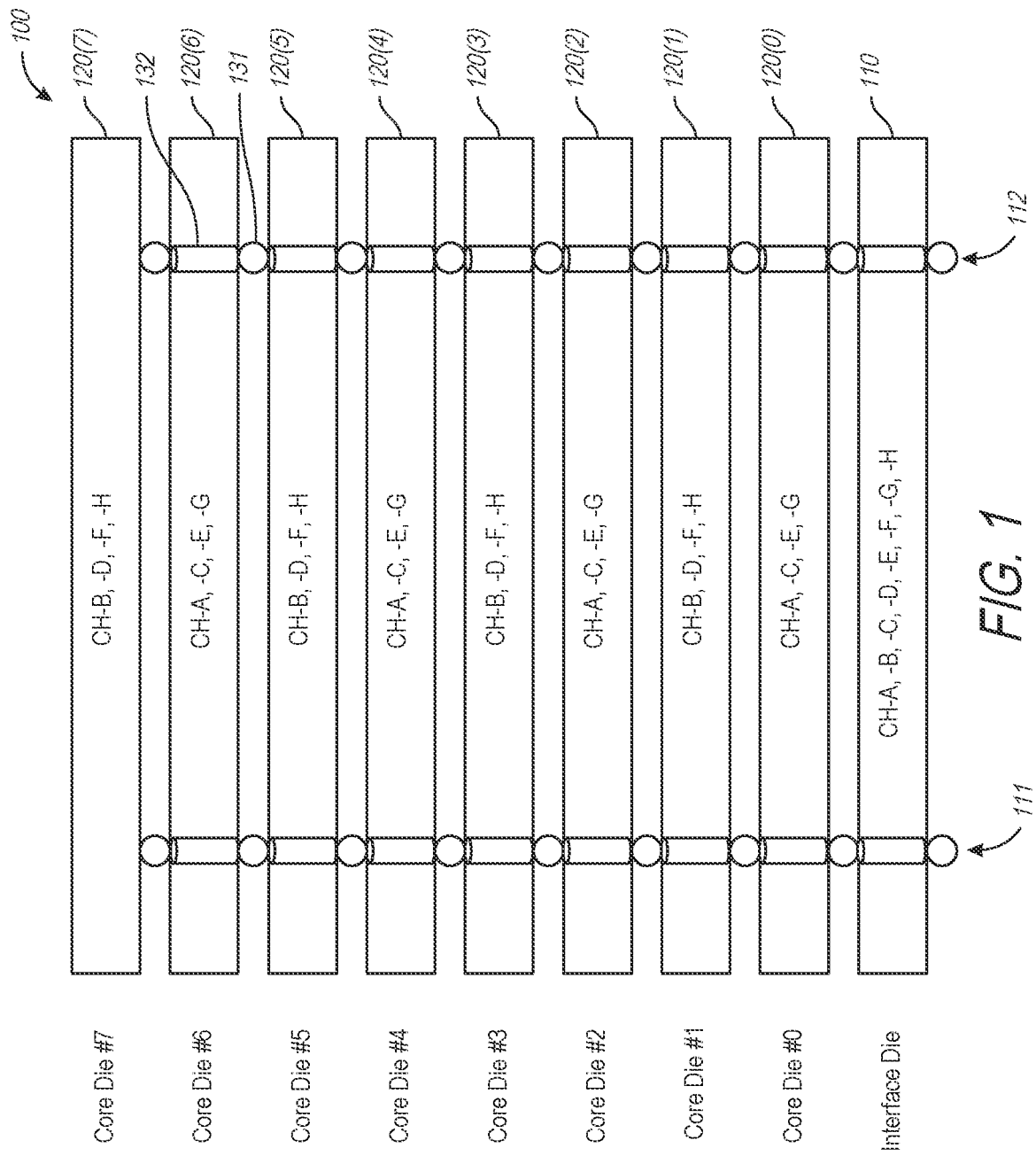
FIG. 1 is a schematic block diagram of a stacked memory device, in accordance with an embodiment of the present disclosure.

FIG. 1 is a schematic block diagram of a stacked memory device 100, in accordance with an embodiment of the present disclosure. The stacked memory device 100 may be implemented as a high-bandwidth memory (HBM) device, in some examples. The stacked memory device 100 includes an interface die 110 and a plurality of (8 in this embodiment) memory core dies #0-#7 120(0)-(7) stacked over the interface die 110. In some examples, the core dies #0-#3 120(0)-(3) may form a first slice and the core dies #4-#7 120(4)-(7) may form a second slice. The interface die 110 and the core dies #0-#7 120(0)-(7) may be electrically interconnected to one another using through-silicon (or substrate) vias (TSVs) 132 and micro-bump electrodes 131 that form paths 111 and 112. In this example, the interface die 110 supports individual channels CH-A to CH-H, of which four channels CH-A, -C, -E and -G are allocated to each of the four core dies #0, #2, #4 and #6 120(0, 2, 4, 6) and remaining four channels CH-B, -D, -E and -H are allocated to each of the four core dies #1, #3, #5 and #7 120(1, 3, 5, 7). The four core dies #0, #2, #4 and #6 120(0, 2, 4, 6) allocated to channels CH-A, -C, -E and -G are stacked in an alternating fashion with one another, and the four core dies #1, #3, #5 and #7 120(1, 3, 5, 7) allocated to channels CH-B, -D, -E and -H are stacked in an alternating fashion with one another. In some examples, path 111 may represent individual conductive paths for channels CH-A-C-HD and the path 112 may represent conductive paths for channels CH-E to CH-H. In some examples, each of the channels CH-A to CH-H may include 128-bit widths. The channels CH-A to CH-D may be configured to provide data and commands from the interface die 110 to the core dies #0-#7 120(0)-(7), and the channels CH-E to CH-H may be configured to provide data from the core dies #0-#7 120(0)-(7) to the interface die 110. The interface die 110 may perform interface functions between a host or processor over command, address, and data buses and the core dies #0-#7 120(0)-(7) over the channels CH-A to CH-H.

In some examples, a source synchronous system is implemented, which includes a simultaneous transmission of read data and a signal for use in latching the read data to transfer the read data. When a slice on the transmitter side and a slice on the receiver side have a one-to-one relationship, data can be transferred without causing problems, even when the slice on the transmitter side and the slice on the receiver side are different due to PVT variations. However, in the case when the slice on the transmitter side and the slice on the receiver side have a many-to-one relationship for a given channel, successful read data transfer may fail to function since a data conflict may occur on the channel due to PVT variations in the dies of the slices on the transmitter side. In order to transfer data among a plurality of slices, in some examples, the data bus sharing among a plurality of slices may be avoided by electrically, as well as physically, separating a data bus so as to provide a one-to-one relationship. In this case, when data is transferred between slices whose data buses are not directly connected, data needs to be once taken to another slice mid-way to the destination, and then data needs to be transmitted again from the mid-way slice. Consequently, a delay occurs in the data transfer, which may be small when the number of stacked dies is small. However, when as the number of stacked dies increases, the delay becomes larger.

Conversely, rather than physically and electrically separating data buses, the stacked memory device 100 may implement shared channels CH-A to CH-H the core die #0-#7 120(0)-(7) to a single receiver of the interface die 110 using a common read data clock and a read command that identifies a particular one of the core dies #0-#7 120(0)-(7). The identified core die provides the read data in response to the read clock signal and the interface die 110 latches or captures the read data provided from the identified core die in response to the read clock signal. Because the data read command includes a core die identifier to identify a single core die to be subjected to a data read operation, only the identified core die responds to the read clock to output the read data. To mitigate timing issues related to PVT variance, the interface die 110 may perform a read data align operation that adjusts propagation delays within the interface die 110 and the core dies #0-#7 120(0)-(7) such that timing differences due to PVT variance is considered. During the timing alignment operation, the interface die 110 and the core dies #0-#7 120(0)-(7) use replica circuitry that mimics propagation delay of normal circuitry to detect propagation delays of a clock signal, and adjustable delay circuits that are configured to adjust a delay along a respective propagation path. The propagation delays are adjusted until propagation delays between the interface die 110 and the core dies #0-#7 120(0)-(7) are aligned. It should be appreciated that, while the stacked memory device 100 includes 8 core dies, more or fewer core dies may be included in the stacked memory device 100.

Figure 2:
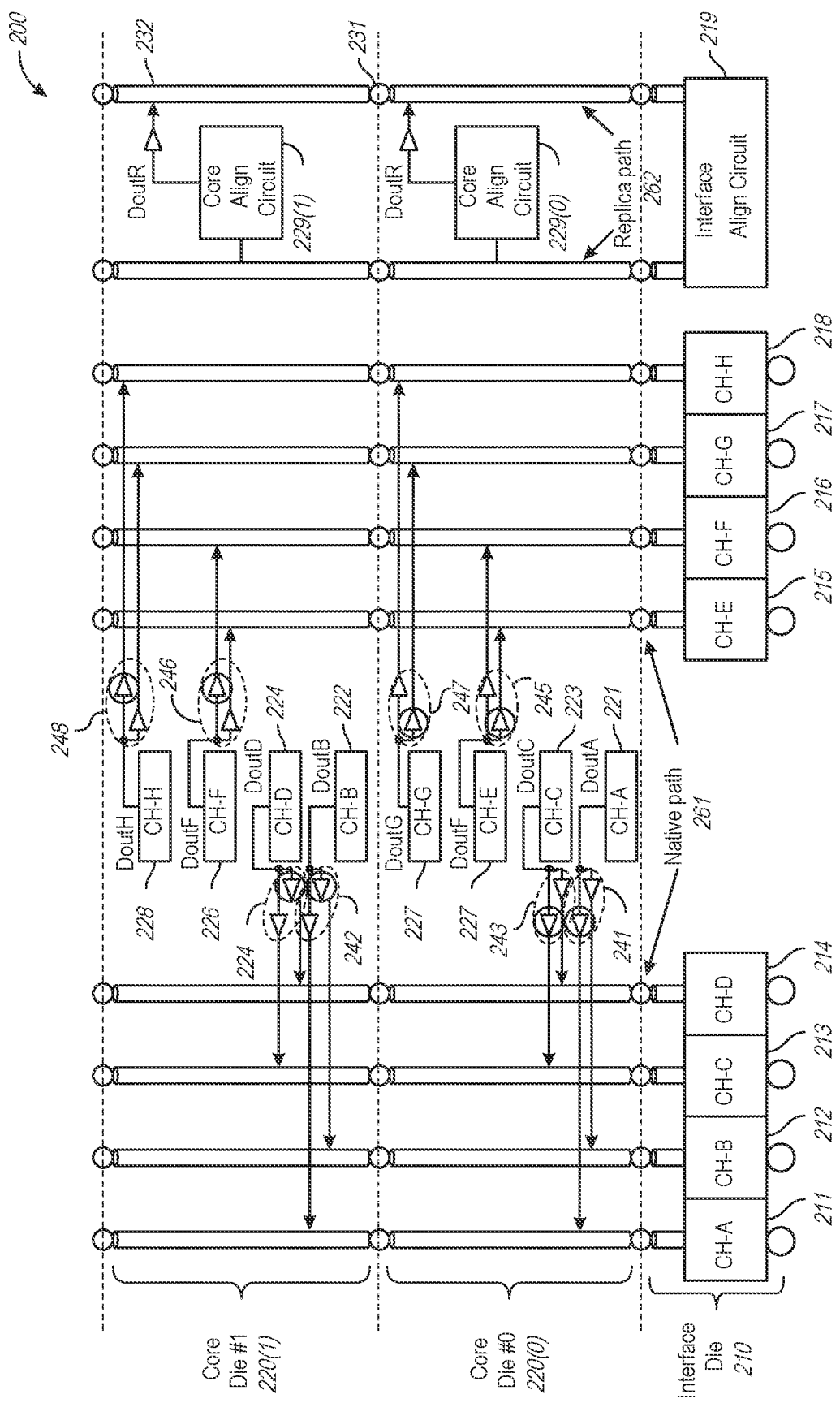
FIG. 2 is a schematic block diagram of a stacked memory device, in accordance with an embodiment of the present disclosure.

FIG. 2 is a schematic block diagram of a stacked memory device 200, in accordance with an embodiment of the present disclosure. The stacked memory device 100 of FIG. 1 may implement the stacked memory device 200. The stacked memory device 200 may be implemented as a high-bandwidth memory (HBM) device, in some examples. The stacked memory device 200 includes an interface die 210 and core dies #0-#1 220(0)-(1) stacked over the interface die 210. The stacked memory device 200 may include additional core die(s) stacked on the core die #1 220(1), similar to the core dies #2-#7 120(2)-(7) of FIG. 1, with configuration of the core die #0 220(0) being mirrored in the core dies 110(2, 4, 6) and configuration of the core die #1 220(1) being mirrored in the core dies 110(3, 5, 7). The interface die 210 and the core dies #0-#1 220(0)-(1) may be electrically interconnected to one another using TSVs 232 and micro-bump electrodes 231.

The interface die 210 includes channel CH-A to CH-H receiver circuits 211-218 that are each configured to communicate over a respective one of the channels CH-A to CH-H to receive read data. The core die #0 220(0) includes a memory circuit 221, a memory circuit 223, a memory circuit 225, and a memory circuit 227 that each includes a respective memory array having a plurality of memory cells. The memory circuit 221, the memory circuit 223, the memory circuit 225, and the memory circuit 227 are configured to communicate over the channels CH-A, -C, -E, and -G using driver circuits 241, 243, 245, and 247, respectively. The core die #1 220(1) includes a memory circuit 222, a memory circuit 224, a memory circuit 226, and a memory circuit 228 that each includes a respective memory array having a plurality of memory cells. The memory circuit 222, the memory circuit 224, the memory circuit 226, and the memory circuit 228 are configured to communicate over the channel CH-B, -D, -F, and -H using driver circuits 242, 244, 246, and 248, respectively.

Together, the CH-A to CH-H receiver circuits 211-218 of the interface die 210; the memory circuit 221, the memory circuit 223, the memory circuit 225, and the memory circuit 225 of the core die #0 220(0); and the memory circuit 222, the memory circuit 224, the memory circuit 226, and the memory circuit 228 of the core die #1 220(1) may form one or more native paths 261 (e.g., a first path) used for communication during normal operation. During normal operation, the interface die 210 may provide a common read data clock and a read command (e.g., provided via separate TSVs not shown) that identifies a particular one of the core dies #0-#1 220(0)-(1). The identified core die provides the read data (e.g., via a respective one of the memory circuits 221-228 and associated one of the driver circuits 241-248) in response to the read clock signal and the interface die 210 latches or captures (e.g., via a respective one of the CH-A to CH-H receiver circuits 211-218) the read data provided from the identified core die in response to the read clock signal. Because the data read command includes a core die identifier to identify a single core die to be subjected to a data read operation, only the identified core die responds to the read clock to output the read data.

To mitigate timing differences (e.g., caused by PVT variance, as well as differences in conductive path lengths) between the core dies #0-#1 220(0)-(1), the stacked memory device 200 may include one or more replica paths 262 (e.g., a second path) between the interface die 210, the core die #0 220(0), and the core die #1 220(1) to perform a read data align operation. The replica path 262 is designed to be similar to the native path 261 in terms of length and propagation delay, such that timing differences are consistent between the replica path 262 and the 261. The ready data align operation may align timing of the core die #0 220(0) and the core die #1 220(1) to mitigate data collisions along shared paths during normal operation. The interface die 210 may include an interface align circuit 219 that is used to determine a delay adjustment for the CH-A to CH-H transceiver circuits 211-218. The core dies #0-#1 220(0)-(1) may each include respective core align circuits 229(0)-(1), each of which is used to determine a delay adjustment for the memory channel circuits. That is, the core align circuit 229(0) is used to determine the delay adjustments for the memory circuit 221, the memory circuit 223, the memory circuit 225, and the memory circuit 225 of the core die #0 220(0); and the core align circuit 229(1) is used to determine the delay adjustments for the memory circuit 222, the memory circuit 224, the memory circuit 226, and the memory circuit 228 of the core die #1 220(1). By implementing the replica path 262 to perform a read data align operation, channel conflicts may be mitigated during normal read data operations, and using common channels may be more efficient as compared with implementations that use physically and electrically isolated channels that require multiple re-transmissions. While the stacked memory device 200 includes 2 core dies, more or fewer core dies may be included in the stacked memory device 200 without departing from the scope of the disclosure.

Figure 3:
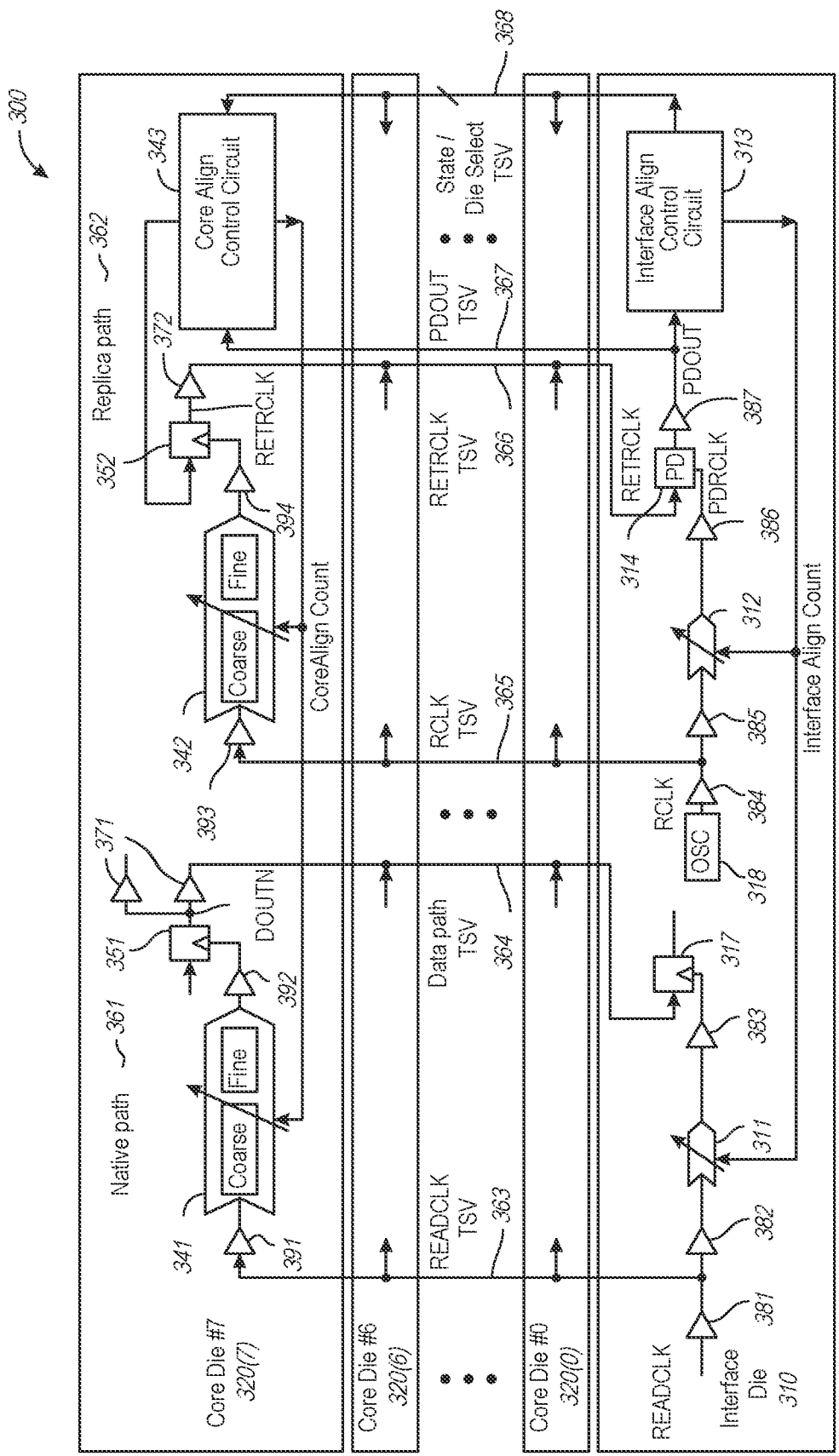
FIG. 3 is a schematic block diagram of a stacked memory device, in accordance with an embodiment of the present disclosure.

FIG. 3 is a schematic block diagram of a stacked memory device 300, in accordance with an embodiment of the present disclosure. The stacked memory device 100 of FIG. 1 and/or the stacked memory device 200 of FIG. 2 may implement the stacked memory device 300. The stacked memory device 300 may be implemented as a high-bandwidth memory (HBM) device, in some examples. The stacked memory device 300 includes an interface chip 310 and core dies #0-#7 320(0)-(7) stacked over the interface chip 310. For clarity, detailed circuitry is only shown for the core die #7 320(7). The core dies #0-#6 320(0)-(6) would include circuitry similar to the circuitry shown as part of the core die #7 320(7).

For normal read data operation (e.g., using the native path 361), the interface chip 310 includes a driver 381, a driver 382, a native interface aligner 311, a driver 383, and an input stage 317. The driver 318 drives a read clock READCLK signal to the core dies #0-#7 320(0)-(7) via the READCLK TSV 363 and to the driver 382. The driver 382 drives the READCLK signal to the native interface aligner 311, which provides a delayed READCLK signal to the driver 383. The native interface aligner 311 includes variable delay circuitry that adjusts a propagation delay of the READCLK signal based on a value of an interface align count signal. The variable delay circuitry of the native interface aligner 311 may include multiple stages that each includes one or more gates (e.g., logic gates, inverters, etc.), and one or more of the multiple stages may be selectively activated or deactivated by the interface align count signal to adjust a propagation path for the READCLK signal, thereby adjusting a propagation delay applied to the READCLK signal. The driver 383 drives the delayed READCLK signal to the input stage 317, and the input stage 317 latches read data DOUTN, that is provided from one of the core die #0-#7 320(0)-(7) and transmitted via the DATA TSV 364, in response to the delayed READCLK signal from the driver 383.

For a read data align operation (e.g., using the replica path 362), the interface chip 310 includes an oscillator 318, a driver 384, a driver 385, a replica interface aligner 312, a driver 386, a phase detector 314, a driver 387, and an interface align control circuit 313. The oscillator 318 provides a replica clock signal RCLK to the driver 384, which drives a RCLK signal to the core dies #0-#7 320(0)-(7) via the RCLK TSV 365 and to the driver 385. The driver 385 drives the RCLK signal to the replica interface aligner 312, which provides a delayed RCLK signal to the driver 386. The replica interface aligner 312 includes variable delay circuitry, similar to the variable delay circuitry of the native interface aligner 311, that adjusts a propagation delay of the RCLK signal based on the value of the interface align count signal. Because the native interface aligner 311 and the replica interface aligner 312 are similar circuits, and because both are controlled by the interface align count signal, the propagation delay through the native interface aligner 311 is equal to the propagation delay through the replica interface aligner 312. The driver 386 drives the delayed RCLK signal to the phase detector 314 as a phase detection clock signal PDRCLK. The phase detector 314 compares the PDRCLK signal from the driver 386 with a returned clock signal RETRCLK received via a RETRCLK TSV 366 and provides a phase detection output signal PDOUT to the interface align control circuit 313 via the driver 387 and to the core align control circuit 343 of the core die #7 320(7) via at PDOUT TSV 367 based on the comparison. The interface align control circuit 313 adjusts a value of the interface align count signal based on a value of the PDOUT signal. The interface align control circuit 313 also controls a state and core die selection of the read data alignment operation, such as an interface die alignment state, a core die coarse alignment state, or a core die fine alignment state. It is to be noted that the RCLK signal may be supplied to the driver 384 from an external device (such as a memory controller or a processor) provided outside the memory device 300, in place of the oscillator 318.

For normal read data operation (e.g., using the native path 361), the core die #7 320(7) includes a driver 391, a native core aligner 341, a driver 392, a native output stage 351, and data drivers 371. The driver 391, the native core aligner 341 and the driver 392 may collectively configure first circuitry. The driver 391 drives the READCLK signal (e.g., received via the READCLK TSV 363) to the native core aligner 341. The native core aligner 341 provides a delayed READCLK signal to the driver 392. The native core aligner 341 includes variable delay circuitry that adjusts a propagation delay of the READCLK signal based on a value of a core align count signal. The variable delay circuitry of the native core aligner 341 may include multiple stages that each include one or more gates (e.g., logic gates, inverters, etc.), and one or more of the multiple stages may be selectively activated or deactivated by the core align count signal to adjust a propagation path for the READCLK signal, thereby adjusting a propagation delay applied to the READCLK signal. In some examples, the native core aligner 341 includes a coarse variable delay circuitry Coarse and fine variable delay circuitry Fine, where the coarse variable delay circuitry may have larger delay adjustment step sizes than the fine variable delay circuitry. That is, the coarse variable delay circuitry may provide an initial delay adjustment applied to the READCLK signal, and the fine variable delay circuitry may provide a more precise adjustment to the delay applied to the READCLK signal. The driver 392 drives the delayed READCLK signal to the native output stage 351, and the native output stage 351 provides the read data DOUTN to the data drivers 371 in response to the delayed READCLK signal. One of the data drivers 371 drives the read data DOUTN to the input stage 317 of the interface chip 310 via the DATA TSV 364.

For a read data align operation (e.g., using the replica path 362), the core die #7 320(7) includes a driver 393, a replica core aligner 342, a driver 394, a replica output stage 352, a driver 372, and a core align control circuit 343. The driver 393, the replica core aligner 342, the driver 394, the replica output stage 352 and the driver 372 may collectively configure second circuitry, and the core align control circuit 343 may configure third circuitry. The driver 393 drives the RCLK signal (provided from the oscillator 318 of the interface die 310 and transmitted through the driver 384 and the RCLK TSV 365) to the replica core aligner 342, which provides a delayed RCLK signal to the driver 394. The replica core aligner 342 includes variable delay circuitry, similar to the variable delay circuitry of the native core aligner 341 (e.g., including the coarse variable delay circuitry and fine variable delay circuitry), that adjusts a propagation delay of the RCLK signal based on the value of the interface align count signal. Because the native core aligner 341 and the replica core aligner 342 are similar circuits, and because both are controlled by the core align count signal, the propagation delay through the native core aligner 341 is equal to the propagation delay through the replica core aligner 342. The driver 394 drives the delayed RCLK signal to the replica output stage 352, and the replica output stage 352 provides replica data DOUTR to the driver 372 in response to the delayed RCLK signal. The driver 372 drives the replica data DOUTR to the phase detector 314 of the interface chip 310 as the RETRCLK. The phase detector 314 compares the delayed RCLK signal (that is PDRCLK) from the driver 386 with a returned RCLK signal (that is RETRCLK) received via a RETRCLK TSV 366 and provides phase detection output signal PDOUT to the interface align control circuit 313 via the driver 387. The interface align control circuit 313 adjusts a value of the interface align count signal based on a value of the PDOUT signal.

In operation, the stacked memory device 300 may perform a read data align operation using the circuitry of the replica path 362. In some examples, the first step may include performing an interface chip align operation that includes determining a value for the IF align count signal provided to the replica interface aligner 312 such that the PDRCLK signal is delayed more than the RETRCLK signal received from every one of the core dies #0-#7 320(0)-(7). A second step of the read data align operation may include performing a core chip coarse alignment operation for each of the core chips the core chips #0-#7 320(0)-(7) to adjust a respective core align count signal provided to the replica core aligner 342 until the RETRCLK signal is delayed more than the PDRCLK signal. Lastly, a third step of the read data align operation may include performing a fine chip coarse alignment for each of the core chips #0-#7 320(0)-(7) to adjust the respective core align count signal provided to the replica core aligner 342 until a delay of the RETRCLK signal becomes substantially equal to the PDRCLK signal. After the read data align operation, the stacked memory device 300 may perform normal memory operations, including providing read data using the native path circuitry 361. In some examples, the interface chip align operation and the core chip coarse align operation may occur during initialization (e.g., prior to starting normal operation), and the core chip fine align operation may be continuously performed during normal operation.

For the interface die align operation, the interface align control circuit 313 sets a state/die select signal value on a state/die select TSV 368 such that the interface die align operation ie designated and one of the core dies #0-#7 320(0)-(7) is identified. The state die select signal is provided to the core dies #0-#7 320(0)-(7) via the state/die select TSV 368. The core align control circuit 343 may initialize the respective core align count signal to a value that applies an initial delay (e.g., a minimum delay) to the RCLK signal through the replica core aligner 342. The oscillator 318 provides the RCLK signal to the driver 393 via the driver 384 and to the replica interface aligner 312 via the drivers 384 and 385. The replica interface aligner 312 delays the RCLK signal based on a value of the interface align count signal to provide the PDRCLK signal to the phase detector 314 via the driver 386. The driver 393 provides the RCLK to the replica core aligner 342, which delays the RCLK signal based on the core align count signal. The replica core aligner 342 provides the delayed RCLK signal to the replica output stage 352 via the driver 394. The replica output stage 352 provides the RETRCLK signal to the phase detector 314 (via the driver 372 and RETRCLK TSV 366) in response to the delayed RCLK signal from the replica core aligner 342. The phase detector 314 compares the PDRCLK signal received from the replica interface aligner 312 via the driver 386 with the RETRCLK signal received via a RETRCLK TSV 366 and provides the phase detection output signal PDOUT to the interface align control circuit 313 via the driver 387. The PDOUT signal indicates whether PDRCLK signal is delayed relative to the RETRCLK (e.g., whether tPDRCLK> or <tRETRCLK). If the tPDRCLK is less than tRETRCLK, the interface align control circuit 313 adjusts a value of the interface align count signal to increase a delay applied to the RCLK signal by the replica interface aligner 312, and another timing comparison of the PDRCLK and RETRCLK signals is performed. When the tPDRCLK is greater than the tRETRCLK, the interface align control circuit 313 selects another one of the core dies #0-#7 320(0)-(7) with the current value of the interface align count signal, so that the interface align control circuit 313 performs another iterative comparison and adjustment operation on the newly selected core die. When the interface align count signal is set to a value that results in the tPDRCLK being greater than the tRETRCLK for all of the core dies #0-#7 320(0)-(7), the process may move on to the core chip coarse alignment operation for each of the core chips the core dies #0-#7 320(0)-(7). During the interface chip align operation, the value of the core align count signal provided from the core align control circuit 343 is kept constant.

For the core die coarse align operation, the interface align control circuit 313 sets the state/die select signal value such that the core die coarse align operation is designated and one of the core dies #0-#7 320(0)-(7) is identified. The oscillator 318 provides the RCLK signal to the driver 393 and to the replica interface aligner 312 via the driver 384 and driver 385. During the core die coarse align operation, the interface align count signal holds such a value that has been obtained by the interface chip align operation. The replica interface aligner 312 continues to provide the PDRCLK signal to the phase detector 314 via the driver 386 and the replica core aligner 342 delays the RCLK signal based on the core align count signal, which clocks the replica output stage 352 to provide the RETRCLK signal to the phase detector 314 (via the driver 372 and RETRCLK TSV 366). The phase detector 314 compares the PDRCLK signal received from the replica interface aligner 312 via the driver 386 with the RETRCLK signal received via a RETRCLK TSV 366 and provides phase detection output signal PDOUT to the core align control circuit 343 via the driver 387 and the PDOUT TSV 367. The PDOUT signal indicates whether PDRCLK signal is delayed relative to the RETRCLK (e.g., whether tPDR-CLK> or <tRETRCLK). If the tPDRCLK is greater than tRETRCLK, the core align control circuit 343 adjusts a coarse delay value of the core align count signal to increase a delay applied to the RCLK signal by the replica core aligner 342, and another timing comparison of the PDRCLK and RETRCLK signals is performed. When the tPDRCLK is less than the tRETRCLK, the core align control circuit 343 may move on to performing the core die coarse align operation on remaining ones of the core chips #0-#7 320 (0)-(7). When the core die coarse align operation for each of the core dies #0-#7 320(0)-(7) is completed, a core die fine align operation for each of the core chips #0-#7 320(0)-(7) is started to perform.

During the core die fine align operation, the interface align control circuit 313 may continuously cycle through the core dies #0-#7 320(0)-(7) to perform the core die fine align operation to continuously fine tune the delay applied by the replica core aligner 342. While performing the core die fine align operation, the replica interface aligner 312 continues to delay the RCLK signal based on the value of the interface align count signal set during the interface chip alignment operation to provide the PDRCLK signal to the phase detector 314 via the driver 386 and the replica core aligner 342 continues to delay the RCLK signal based on the coarse delay value of the core align count signal portion of the core chip align signal to provide the RETRCLK signal to the phase detector 314. Rather than taking place until a particular timing relationship between the PDRCLK signal and the RETCLK signal are achieved, the core chip fine align operation may be performed for a set number of M iterations, where M is any integer number. The core chip fine align operation may be performed based on instantaneous changes to samples of the PDOUT signal values, and/or may be performed based on an average value of several samples of the PDOUT signal. In some examples, the core chip fine align operation may be initially performed on each of the each of the core dies #0-#7 320(0)-(7) using the instantaneous samples, and then may be continuously performed thereafter based on an average value.

In the instantaneous sample implementation, when the PDOUT signal indicates a timing difference between the PDRCLK and the RETRCLK signals, the core align control circuit 343 adjusts a value of a fine delay value of the core align count signal to change (e.g., increase or decrease) a delay applied to the RCLK signal by the replica core aligner 342 based on the detected timing difference. After the adjustment, another timing comparison of the PDRCLK and RETRCLK signals is performed, and the fine delay value is adjusted again.

In the average sample implementation, the core align control circuit 343 only adjusts the fine delay value of the core align count signal to increase or decrease a delay applied to the RCLK signal by the replica core aligner 342 when a counter of the core align control circuit 343 reaches a specified minimum value (e.g., indicating a delay by the replica core aligner 342 is too long) or a specified maximum value (e.g., indicating a delay by the replica core aligner 342 is too short). After an adjustment, the counter is reset and another adjustment does not take place until the counter again reaches the specified minimum value or the specified maximum value. After a specified number of samples for the core chip fine align operation for a selected one of the core dies #-#7 320(0)-(7), the interface align control circuit 313 may select a next one of the core dies #0-#7 320(0)-(7). After all of the core dies #0-#7 320(0)-(7) have performed a first iteration of the core chip fine align operation, the interface align control circuit 313 may start a second iteration of the core chip fine align operation on each of the core dies #0-#7 320(0)-(7). The iterations of the core chip fine align operation may repeat continuously during operation.

For normal read data operation (e.g., using the native path 361), because propagation delay and overall timing of the native path 361 is similar to the replica path 362, the delay applied to the READCLK signal by the native interface aligner 311 may be similar to the delay applied to the RCLK signal by the replica interface aligner 312 (e.g., both based on the value of the interface align count signal), and the delay applied to the READCLK signal by the native core aligner 341 may be similar to the delay applied to the RCLK signal by the replica core aligner 342 (e.g., both based on the set coarse and fine values of the core align count signal). Using these delay values that align timing of the READCLK via the READCLK TSV 363 and the data via the DATA TSV 364, a probability of data collisions along the DATA TSV 364 and data corruption of data captured at the input stage 317 may be reduced. It appreciated that, while the stacked memory device 300 includes 7 core die, more or fewer core die may be included in the stacked memory device 300.

Figure 4:
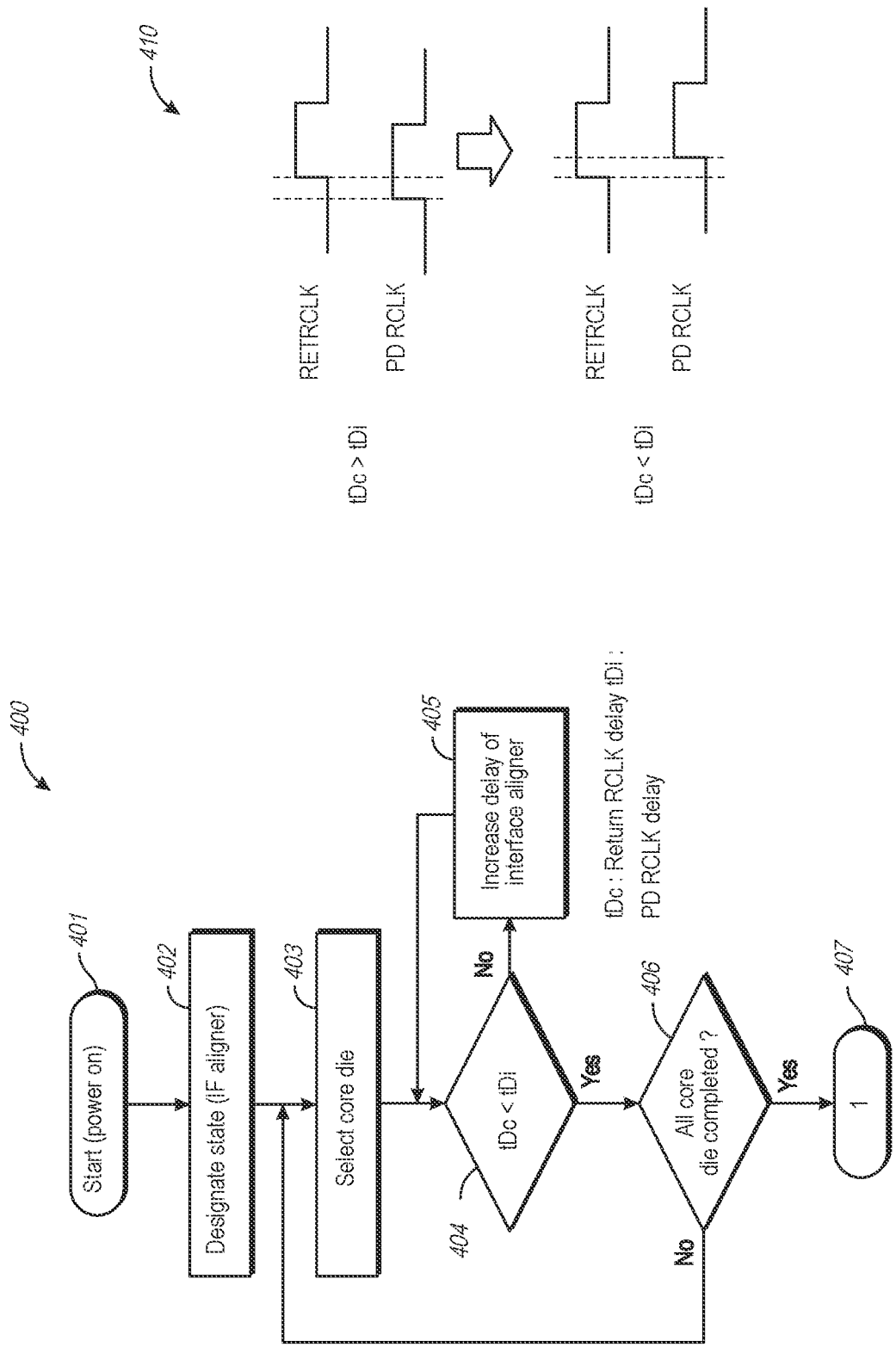
FIG. 4 is a flow diagram of a method for performing an interface die (chip) align operation, in accordance with an embodiment of the present disclosure.

FIG. 4 is a flow diagram of a method 400 for performing an interface die align operation, in accordance with an embodiment of the present disclosure. The stacked memory device 100 of FIG. 1, the stacked memory device 200 of FIG. 2, the stacked memory device 300 of FIG. 3, or combinations thereof may implement the method 400.

The method 400 may include starting (e.g., powering on, resetting, etc.) a stacked memory device, such as the stacked memory device 100 of FIG. 1, the stacked memory device 200 of FIG. 2, or the stacked memory device 300 of FIG. 3, at 401. The method 400 may further include designating an interface die align operation state, at 402. The state may be designated by the interface align control circuit 313 of FIG. 3. The method 400 may further include selecting a core die, at 403. The selected core die may include one of the core dies #0-#7 120(0)-(7) of FIG. 1, the core dies #0-#220(0)-(1) of FIG. 2, or the core dies #0-#7 320(0)-(7) of FIG. 3. The selection of the core dies may be performed by the interface align control circuit 313 of FIG. 3.

The method 400 may further include comparing timing of the PDRCLK signal (tDi) with the timing of the RETRCLK (tDc), at 404. If the tDc is not less than the tDi, the method 400 includes increasing a delay applied to the RCLK signal by an interface aligner (e.g., the replica interface aligner 312 of FIG. 3), at 405, and the tDc and tDi comparison, at 404, is repeated. When the tDc is less than the tDi (e.g., such as is depicted in the transition in relative timing between the RETRCLK and PDCLK signals shown in the timing diagram 410), the method 400 may include determining whether all of the core dies have completed the interface chip align operation, at 406, and if not, another core die is selected, at 403, to perform the interface chip align operation. Once all of the core dies have completed the interface chip align operation, the method 400 is completed, at 407. Once the method 400 is complete, a delay applied by the interface align may result in the tDi being greater than the tDc for all of the core dies.

Figure 5:
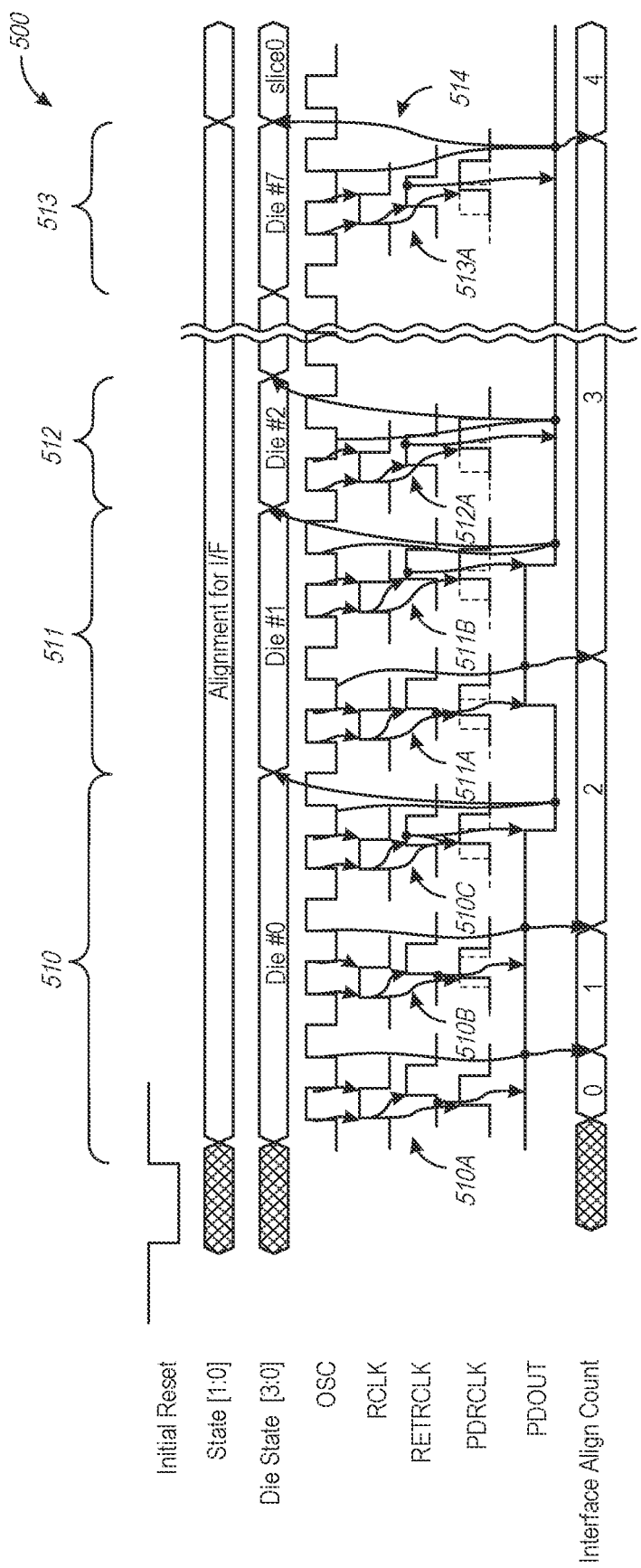
FIG. 5 is an exemplary timing diagram depicting a portion of an interface die (chip) align operation according to an embodiment of the disclosure.

FIG. 5 is an exemplary timing diagram 500 depicting a portion of an interface die align operation according to an embodiment of the disclosure. The portion of the interface die align operation may be performed using the method 400 of FIG. 4. The state [1:0] and the die select [3:0] signals may be provided from the interface align control circuit 313 of FIG. 3 to the core align control circuit 343 via the state/die select TSV 368. The OSC signal may be an oscillator signal provided by an oscillatory, such as the oscillator 318 of FIG. 3. The RCLK signal, the RETRCLK signal, the PDRCLK signal, the PDOUT signal, and the interface align count signal may correspond to the RCLK signal, the RETRCLK signal, the PDRCLK signal, the PDOUT signal, and the interface align count signal, respectively, of FIG. 3.

Both the RETRCLK and the PDRCLK are based on the RCLK signal, but propagated through different paths, as described with reference to FIG. 3. During time period 510, the interface chip align operation starts with a core die #0, as indicated by the die select signal [3:0]. For the core die #0, timing of the RETRCLK signal is compared with timing of the PDRCLK signal to determine the PDOUT signal. At time 510A, because the timing of the PDRCLK signal is ahead of the timing of the RETRCLK signal, the PDOUT signal is high, causing the interface align counter signal to increase by 1 to a value of 1. At time 510B, because the timing of the PDRCLK signal remains ahead of the timing of the RETRCLK signal, the PDOUT signal remains high, causing the interface align counter signal to increase by 1 to a value of 2. At time 510C, because the timing of the PDRCLK signal is now behind the timing of the RETRCLK signal, the PDOUT signal transitions low, causing the interface align counter signal to remain at a value of 2.

In response to the PDOUT signal having a low value, the timing diagram 500 transitions to time period 511. During time period 511, the die select signal [3:0] selects core die #1, and the interface align count signal starts with a value of 2, which is over from time period 510 associated with core die #1. At time 511A, because the timing of the PDRCLK signal is ahead of the timing of the RETRCLK signal, the PDOUT signal transitions high, causing the interface align counter signal to increase by 1 to a value of 3. At time 511B, because the timing of the PDRCLK signal is now behind the timing of the RETRCLK signal, the PDOUT signal transitions low, causing the interface align counter signal to remain at a value of 3.

In response to the PDOUT signal having a low value, the timing diagram 500 transitions to time period 512. During time period 512, the die select signal [3:0] switches to a next core die #2. At time 512A, because the timing of the PDRCLK signal is now behind the timing of the RETRCLK signal, the PDOUT signal transitions low, causing the interface align counter signal to remain at a value of 3. This process continues until, time period 513, where the interface align count signal is adjusted, if necessary, based on the timing of the PDRCLK signal relative to the timing of the RETRCLK signal for core die #7. At time 514, the interface chip align operation is completed for all the core dies #0-#7. It is appreciated that the timing diagram 500 is exemplary, and relative timing between signals may vary from the relative timing depicted in the timing diagram 500. It is further appreciated that an order or core die may be different than depicted, such as starting with core die #7. It is further appreciated that, while the timing diagram 500 includes 8 core dies, more or fewer core dies may be included in a stacked semiconductor device.

Figure 6:
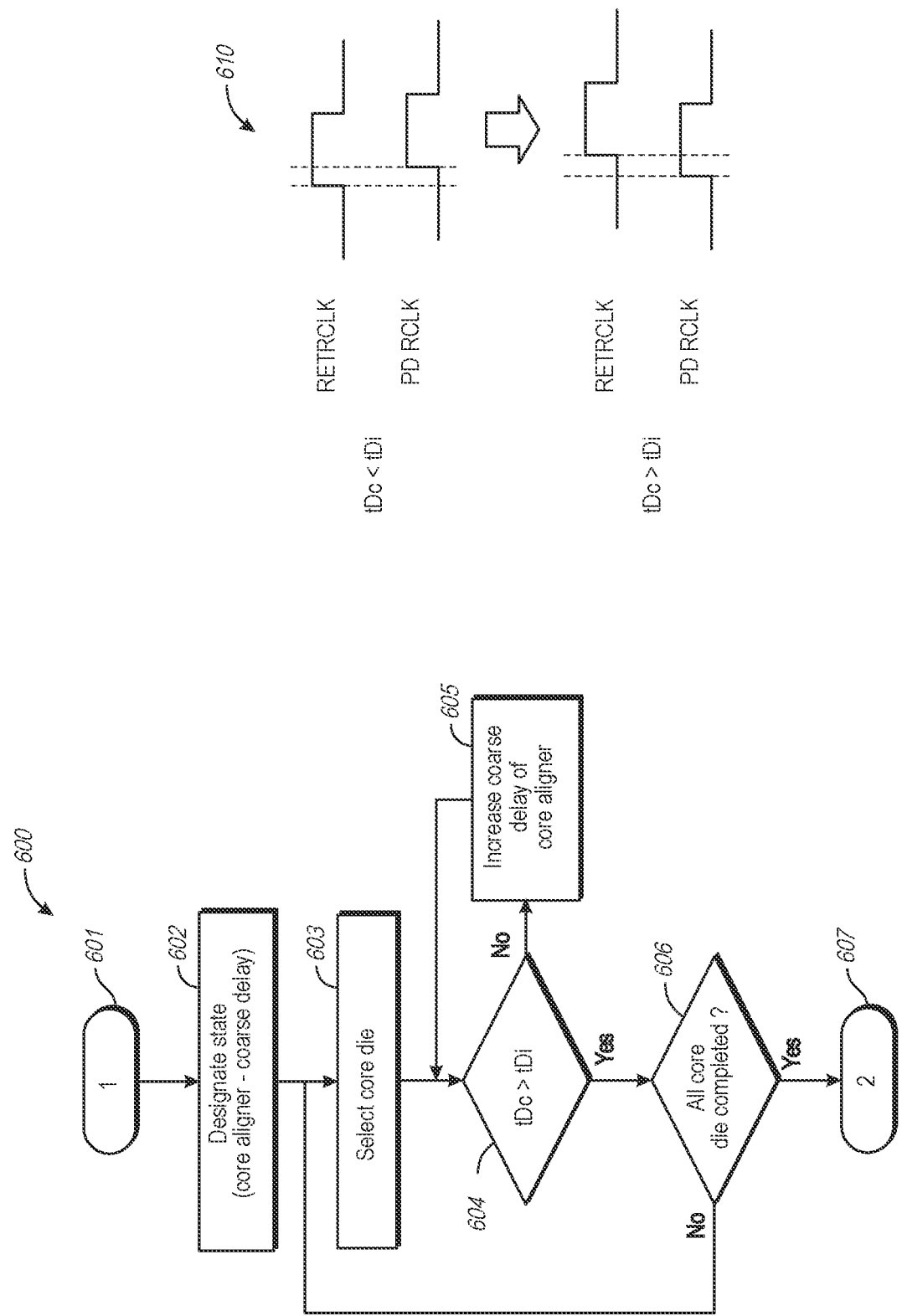
FIG. 6 is a flow diagram of a method for performing a memory core die (chip) coarse align operation, in accordance with an embodiment of the present disclosure.

FIG. 6 is a flow diagram of a method 600 for performing an core die coarse align operation, in accordance with an embodiment of the present disclosure. The stacked memory device 100 of FIG. 1, the stacked memory device 200 of FIG. 2, the stacked memory device 300 of FIG. 3, or combinations thereof may implement the method 600.

The method 600 may include continuing from an interface die align operation, such as the interface die align operation of the method 400 of FIG. 4, at 601. The method 600 may further include designating an core die coarse align operation state, at 602. The state may be designated by the interface align control circuit 313 of FIG. 3. The method 600 may further include selecting a core die, at 603. The selected core die may include one of the core dies #0-#7 120(0)-(7) of FIG. 1, the core dies #0-#1 220(0)-(1) of FIG. 2, or the core dies #0-#7 320(0)-(7) of FIG. 3. The selection of the core dies may be performed by the interface align control circuit 313 of FIG. 3.

The method 600 may further include comparing timing of the PDRCLK signal (tDi) with the timing of the RETRCLK (tDc), at 604. If the tDc is not greater than the tDi, the method 600 may further include increasing a coarse delay applied to the RCLK signal by a core chip aligner (e.g., the replica core aligner 342 of FIG. 3), at 605, and the tDc and tDi comparison, at 604, is repeated. The delay may be increased by adjusting a value of a coarse delay value of a core align signal, such as the core align signal of FIG. 3. The timing comparison and core align signal change may be performed by core align control circuit, such as the core align control circuit 343 of FIG. 3. When the tDc is greater than the tDi (e.g., such as is depicted in the transition in relative timing between the RETRCLK and PDCLK signals shown in the timing diagram 610), the method 600 may include determining whether all of the core dies have completed the core die coarse align operation, at 606, and if not, another core die is selected, at 603 to perform the core die coarse align operation. Once all of the core dies have completed the core die coarse align operation, the method 600 is completed, at 607.

Figure 7:
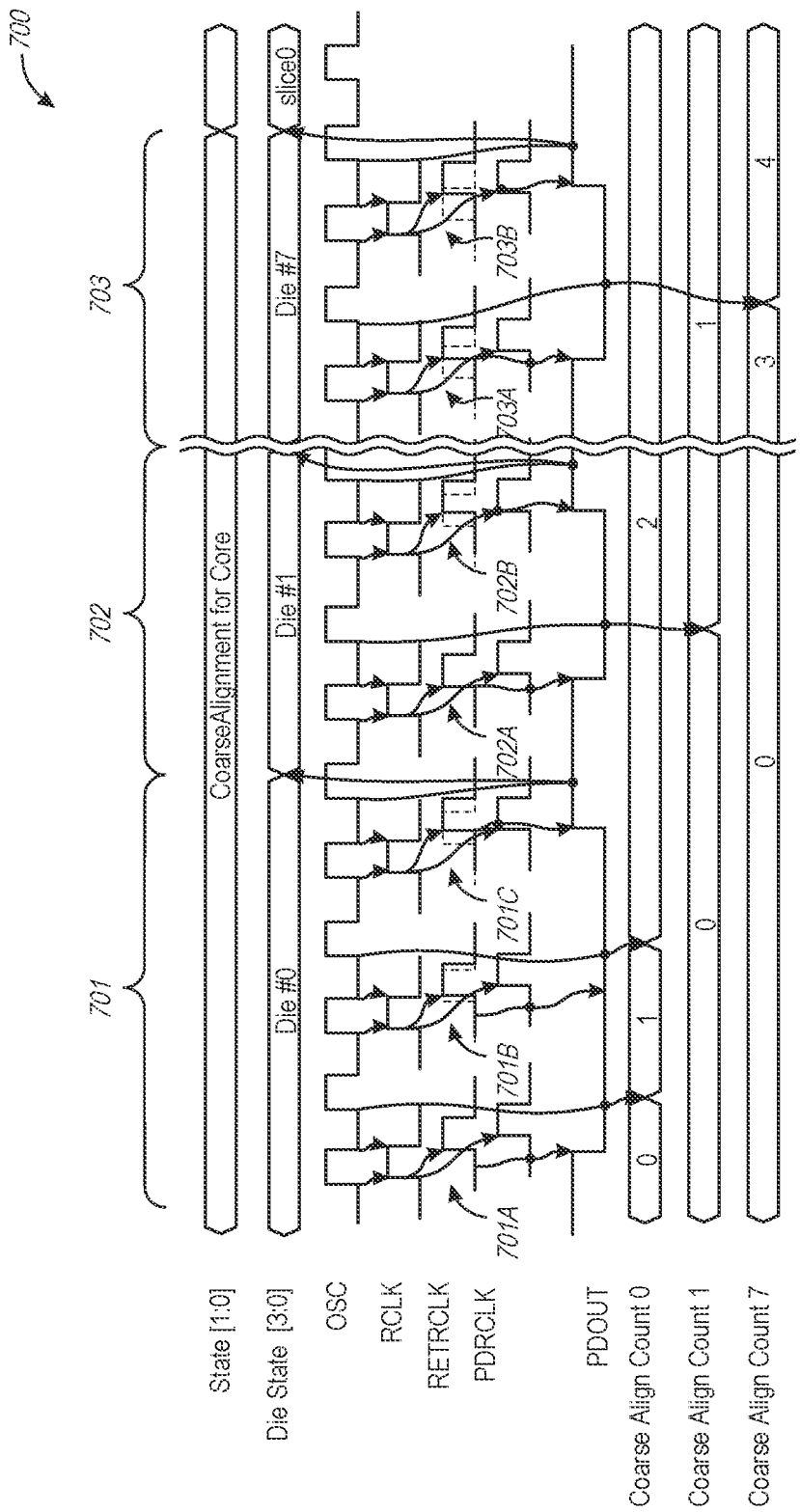
FIG. 7 is an exemplary timing diagram depicting a portion of a memory core die (chip) coarse align operation according to an embodiment of the disclosure.

FIG. 7 is an exemplary timing diagram 700 depicting a portion of a core die coarse align operation according to an embodiment of the disclosure. The portion of the core die coarse align operation may be performed using the method 600 of FIG. 6. The state [1:0] and the die select [3:0] signals may be provided from the interface align control circuit 313 of FIG. 3 to the core align control circuit 343 via the state/die select TSV 368. The OSC signal may be an oscillator signal provided by an oscillatory, such as the oscillator 318 of FIG. 3. The RCLK signal, the RETRCLK signal, the PDRCLK signal, and the PDOUT signal may correspond to the RCLK signal, the RETRCLK signal, the PDRCLK signal, and the PDOUT signal, respectively, of FIG. 3. The coarse align count 0, 1, and 7 signals may correspond to a coarse delay values 0, 1, and 7 of the core align count 0, 1, and 7 signals, respectively, of the core dies #0, #1, and #7 320(0), (1), and (7), respectively, of FIG. 3

Both the RETRCLK and the PDRCLK are based on the RCLK signal, but propagated through different paths, as described with reference to FIG. 3. During time period 701, the core die coarse align operation starts with a core die #0, as indicated by the die select signal [3:0], and the corresponding coarse align count 0 signal is initialized to a value of zero. For the core die #0, timing of the RETRCLK signal is compared with timing of the PDRCLK signal to determine the PDOUT signal. At time 701A, because the timing of the PDRCLK signal is behind the timing of the RETRCLK signal, the PDOUT signal transitions low, causing the coarse align count 0 signal to increase by 1 to a value of 1. At time 701B, because the timing of the PDRCLK signal remains behind the timing of the RETRCLK signal, the PDOUT signal remains low, causing the coarse align count 0 signal to increase by 1 to a value of 2. At time 701C, because the timing of the PDRCLK signal is now ahead of the timing of the RETRCLK signal, the PDOUT signal transitions high, causing the coarse align count 0 signal to remain at a value of 2.

In response to the PDOUT signal having a high value, the timing diagram 700 transitions to time period 702. During time period 702, the die select signal [3:0] selects core die #1, and the coarse align count 1 signal is initialized to a value of 0. At time 702A, because the timing of the PDRCLK signal is behind the timing of the RETRCLK signal, the PDOUT signal transitions low, causing the coarse align count 1 signal to increase by 1 to a value of 1. At time 702B, because the timing of the PDRCLK signal is now ahead of the timing of the RETRCLK signal, the PDOUT signal transitions high, causing the coarse align count 1 signal to remain at a value of 1.

The process proceeds through core die #3 to core die #7, which is partially included in time period 703. At the start of time period 703, the coarse align count 7 signal has already increased to a value of 3. At time 703A, because the timing of the PDRCLK signal is behind the timing of the RETRCLK signal, the PDOUT signal transitions low, causing the coarse align count 7 signal to increase by 1 to a value of 4.

At time 703B, because the timing of the PDRCLK signal is now ahead of the timing of the RETRCLK signal, the PDOUT signal transitions high, causing the coarse align count 7 signal to remain at a value of 4. At the end of time period 703, the core chip coarse align operation is completed for core dies #0-#7. It is appreciated that the timing diagram 700 is exemplary, and relative timing between signals may vary from the relative timing depicted in the timing diagram 700. It is further appreciated that an order of core dies may be different than depicted, such as starting with core die #7. It is further appreciated that, while the timing diagram 700 includes 8 core dies, more or fewer core dies may be included in a stacked semiconductor device.

Figure 8:
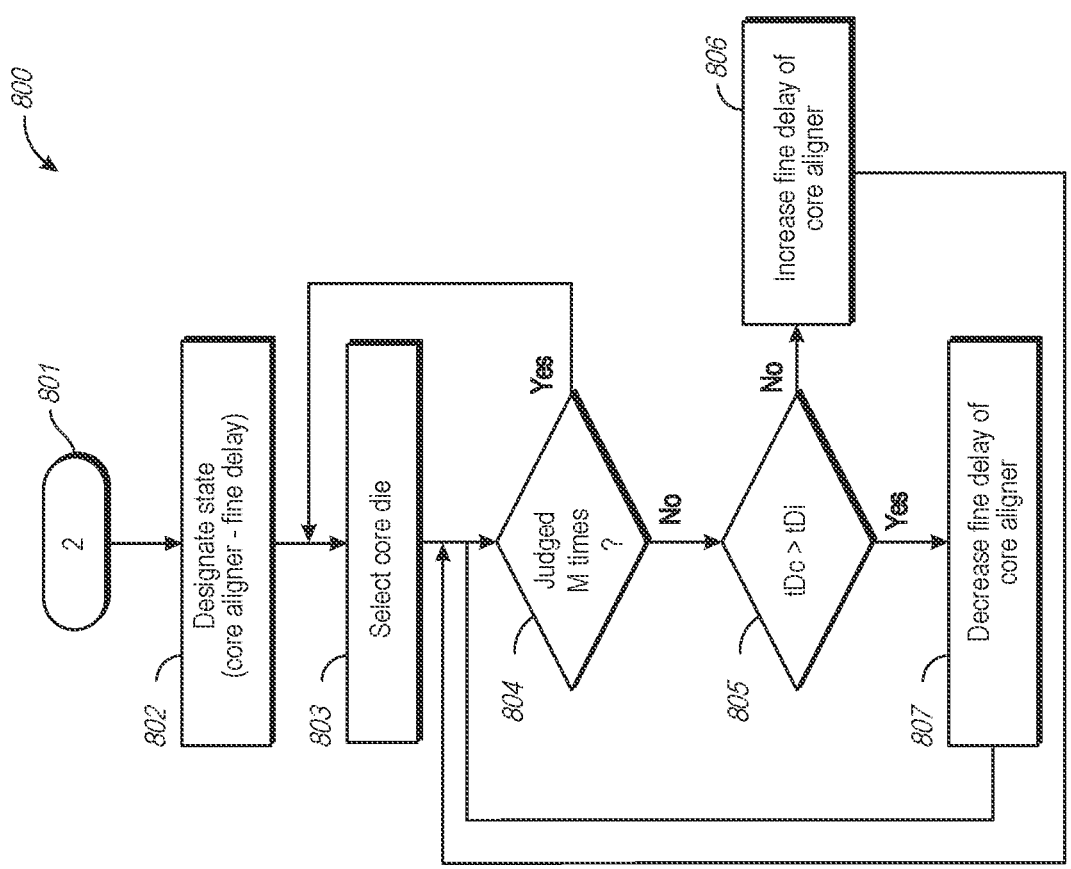
FIG. 8 is a flow diagram of a method for performing a memory core die (chip) fine align operation without averaging, in accordance with an embodiment of the present disclosure.

FIG. 8 is a flow diagram of a method 800 for performing a core die fine align operation without averaging, in accordance with an embodiment of the present disclosure. The stacked memory device 100 of FIG. 1, the stacked memory device 200 of FIG. 2, the stacked memory device 300 of FIG. 3, or combinations thereof may implement the method 800.

The method 800 may include continuing from a core die coarse align operation, such as the core die coarse align operation of the method 600 of FIG. 6, at 801. The method 800 may further include designating a core chip fine align operation state, at 802. The state may be designated by the interface align control circuit 313 of FIG. 3. The method 800 may further include selecting a core die, at 803. The selected core die may include one of the core dies #0-#7 120(0)-(7) of FIG. 1, the core dies #0-#1 220(0)-(1) of FIG. 2, or the core dies #0-#7 320(0)-(7) of FIG. 3. The selection of the core die may be performed by the interface align control circuit 313 of FIG. 3.

The method 800 may further include determining whether a fine adjustment (e.g., at steps 805, 806, and/or 807) have been performed M times, at 804. M may include any integer value. That is, rather than performing fine adjustments until a particular timing relationship between the PDRCLK and RETRCLK is achieved, M fine adjustment iterations are performed. The method 800 may further include comparing timing of the PDRCLK signal (tDi) with the timing of the RETRCLK (tDc), at 805. If the tDc is less than the tDi, the method 800 may further include increasing a fine delay applied to the RCLK signal by a core chip aligner (e.g., the replica core aligner 342 of FIG. 3), at 806, and comparing the find adjustment iteration count with the M value, at 804, is repeated. If the tDc is greater than the tDi, the method 800 may further include decreasing the fine delay applied to the RCLK signal, at 807, and comparing the fine adjustment iteration count with the M value, at 804, is repeated. Once M fine adjustment iterations of the fine adjustment for a core die have been performed, the method 800 further includes selecting another core die, at 803, and performing M fine adjustment iterations (e.g., via steps 804, 805, 806, and 807) on the newly selected core die. The method 800 may include repeatedly cycling through the core die, starting over with a first core die once a last core die has completed M fine adjustment iterations.

Figure 9:
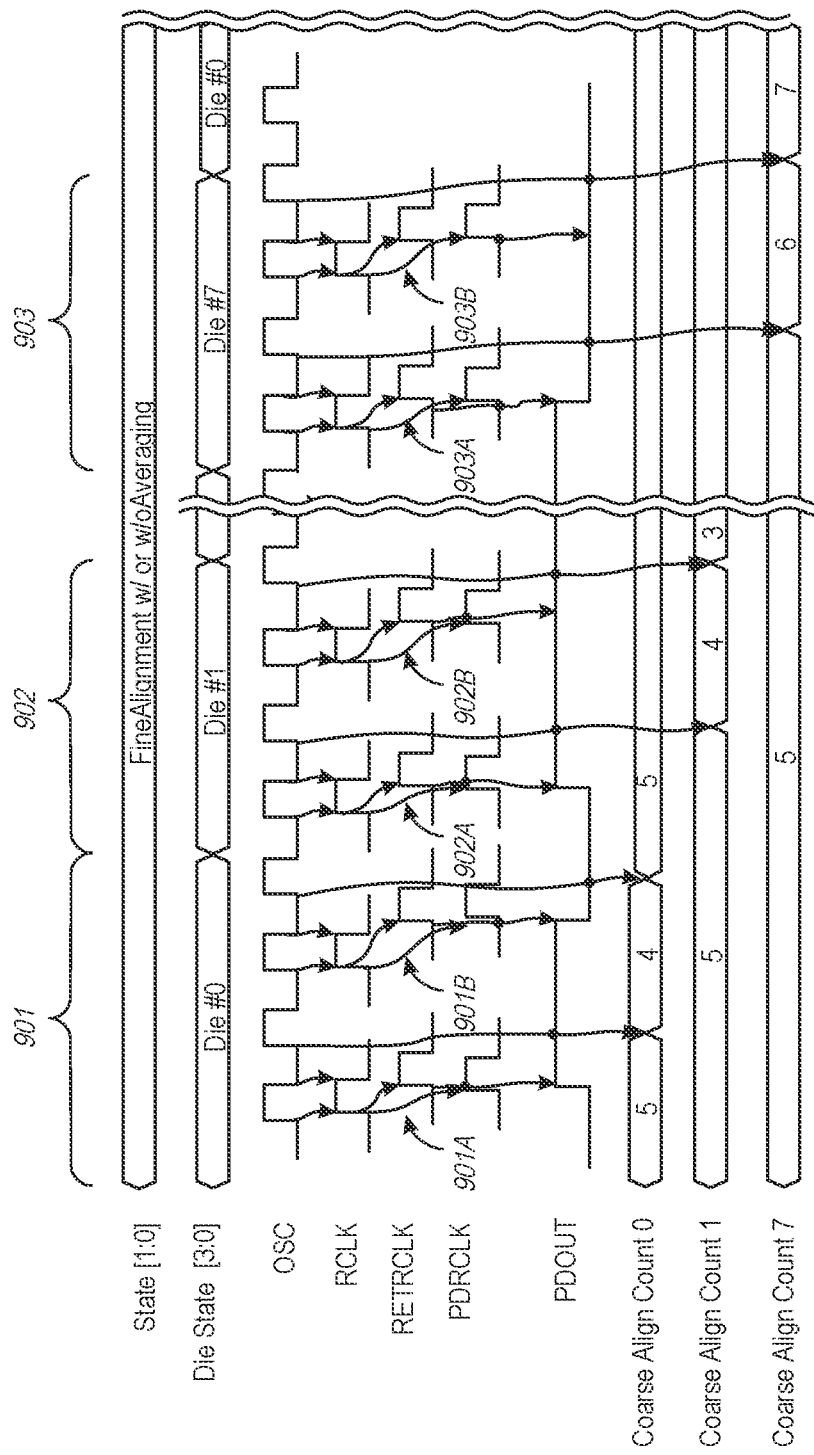
FIG. 9 is an exemplary timing diagram depicting a portion of a memory (core) chip fine align operation without averaging according to an embodiment of the disclosure.

FIG. 9 is an exemplary timing diagram 900 depicting a portion of a core die fine align operation without averaging according to an embodiment of the disclosure. The portion of the core die fine align operation may be performed using the method 800 of FIG. 8. The state [1:0] and the die select [3:0] signals may be provided from the interface align control circuit 313 of FIG. 3 to the core align control circuit 343 via the state/die select TSV 368. The OSC signal may be an oscillator signal provided by an oscillatory, such as the oscillator 318 of FIG. 3. The RCLK signal, the RETRCLK signal, the PDRCLK signal, and the PDOUT signal may correspond to the RCLK signal, the RETRCLK signal, the PDRCLK signal, and the PDOUT signal, respectively, of FIG. 3. The fine align count 0, 1, and 7 signals may correspond to a fine delay values 0, 1, and 7 of the core align count 0, 1, and 7 signals, respectively, of the core die #0, #1, and #7 320(0), (1), and (7), respectively, of FIG. 3

Both the RETRCLK and the PDRCLK are based on the RCLK signal, but propagated through different paths, as described with reference to FIG. 3. During time period 901, the core chip fine align operation is continued from a previous cycle for the core die #0, as indicated the fine align count 0 signal having a value of five. At time 901A, because the timing of the PDRCLK signal is ahead of the timing of the RETRCLK signal, the PDOUT signal remains high, causing the fine align count 0 signal to decrease by 1 to a value of 4. At time 901B, because the timing of the PDRCLK signal is now ahead of the timing of the RETRCLK signal, the PDOUT signal transitions low, causing the fine align count 0 signal to increase by 1 to a value of 5.

After M iterations of the core chip fine align operation associated with core die #0, the timing diagram 900 transitions to a time period 902 associated with the core die #1, wherein the fine align count 1 signal has incremented to a value of 5. At time 902A, because the timing of the PDRCLK signal is ahead of the timing of the RETRCLK signal, the PDOUT signal transitions high, causing the fine align count 1 signal to decrease by 1 to a value of 4. At time 902B, because the timing of the PDRCLK signal is remains ahead of the timing of the RETRCLK signal, the PDOUT signal remains high, causing the fine align count 1 signal to further decrease by 1 to a value of 3.

The process proceeds through core die #3-#6 to the core die #7 indicated by the time period 903. At the start of time period 903, the fine align count 7 signal is set to a value of 5 At time 903A, because the timing of the PDRCLK signal is behind the timing of the RETRCLK signal, the PDOUT signal transitions low, causing the fine align count 7 signal to increase by 1 to a value of 6. At time 903B, because the timing of the PDRCLK signal is behind the timing of the RETRCLK signal, the PDOUT signal remains low, causing the fine align count 7 signal to increase by 1 to a value of 7. At the end of time period 903, the core chip fine align operation starts over with core die #0, and proceeds to sequentially cycle through the core dies #0-#7 continuously. It is appreciated that the timing diagram 900 is exemplary, and relative timing between signals may vary from the relative timing depicted in the timing diagram 900. It is further appreciated that an order of core dies may be different than depicted, such as starting with core die #7. It is further appreciated that, while the timing diagram 900 includes 8 core dies, more or fewer core dies may be included in a stacked semiconductor device.

Figure 10A:
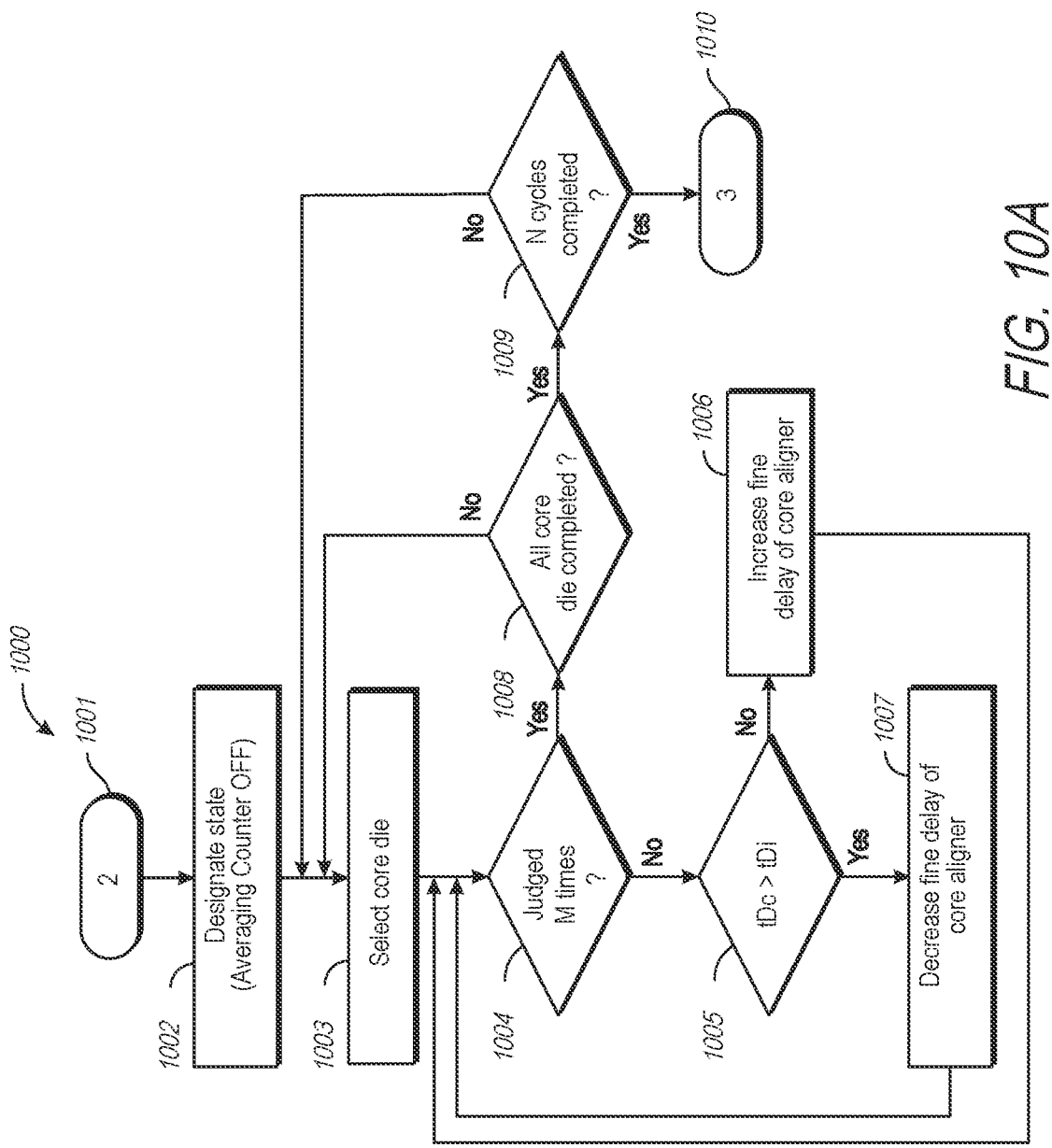
FIGS. 10A and 10B are a flow diagrams of a method for performing a memory core die (chip) fine align operation with averaging, in accordance with an embodiment of the present disclosure.
Figure 10B:
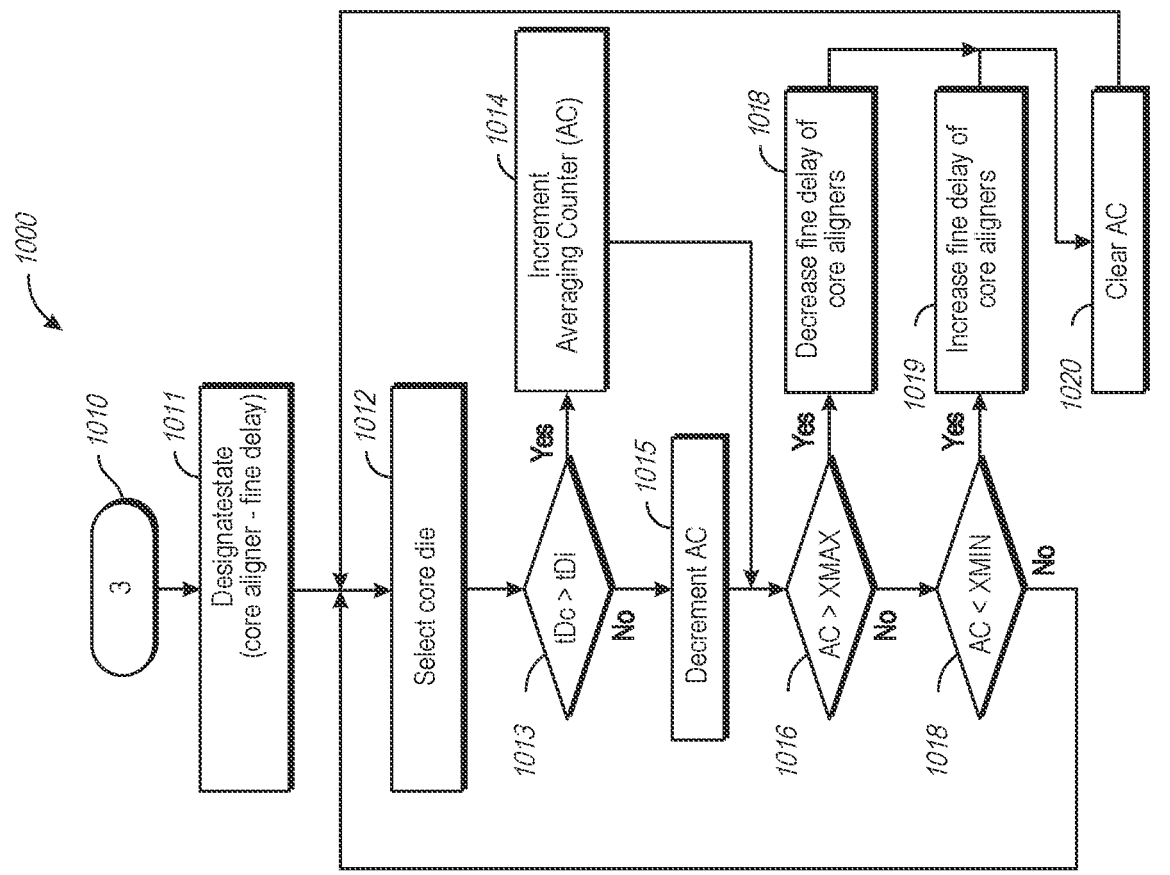

FIGS. 10A and 10B are a flow diagrams of a method 1000 for performing a core die fine align operation with averaging, in accordance with an embodiment of the present disclosure. The stacked memory device 100 of FIG. 1, the stacked memory device 200 of FIG. 2, the stacked memory device 300 of FIG. 3, or combinations thereof may implement the method 1000.

Turning to FIG. 10A, the method 1000 may include continuing from a core die coarse align operation, such as the core die coarse align operation of the method 600 of FIG. 6, at 1001. The method 1000 may further include designating a core chip fine align operation state with averaging function turned off, at 1002. The state may be designated by the interface align control circuit 313 of FIG. 3. The method 1000 may further include selecting a core die, at 1003. The selected core die may include one of the core die #0-#7 120(0)-(7) of FIG. 1, the core die #0-#1 220(0)-(1) of FIG. 2, or the core die #0-#7 320(0)-(7) of FIG. 3. The selection of the core die may be performed by the interface align control circuit 313 of FIG. 3.

The method 1000 may further include determining whether a fine adjustment (e.g., at steps 1005, 1006, and/or 1007) have been performed M times, at 1004. M may include any integer value. That is, rather than performing fine adjustments until a particular timing relationship between the PDRCLK and RETRCLK is achieved, M fine adjustment iterations are performed. The method 1000 may further include comparing timing of the PDRCLK signal (tDi) with the timing of the RETRCLK (tDc), at 1005. If the tDc is less than the tDi, the method 1000 may further include increasing a fine delay applied to the RCLK signal by a core chip aligner (e.g., the replica core aligner 342 of FIG. 3), at 1006, and comparing the fine adjustment iteration count with the M value, at 1004, is repeated. If the tDc is greater than the tDi, the method 1000 may further include decreasing the fine delay applied to the RCLK signal, at 1007, and comparing the fine adjustment iteration count with the M value, at 1004, is repeated. Once M fine adjustment iterations for a core die have been performed, the method 1000 includes determining whether all core dies have completed M fine adjustment iterations (e.g., at steps 1004, 1005, 1006, and/or 1007), at 1008. If not, the method 1000 may include selecting another core die, at 1003, and performing M fine adjustment iterations (e.g., via steps 1004, 1005, 1006, and 1007) on the newly selected core die. Once all core dies have performed M fine adjustment iterations (e.g., one cycle), the method 1000 may include determining whether N cycles have been completed, at 1009. N may be any integer number. If N cycles have not been completed, the method 1000 includes starting a new cycle by selecting a first core die, at 1003. When N cycles have been completed, the method 1000 may move to step 1010.

Turning now to FIG. 10B, moving from step 1010, the method 1000 may further include designating a core die fine align operation state with averaging function turned on, at 1011, and selecting a core die, at 1012. The method 1000 may further include comparing timing of the PDRCLK signal (tDi) with the timing of the RETRCLK (tDc), at 1013. If the tDc is greater than the tDi, the method 1000 includes incrementing an averaging counter, at 1014. If the tDc is less than the tDi, the method 1000 includes decrementing the averaging counter, at 1015. The averaging counter may be maintained by a core align control circuit, such as the core align control circuit 343 of FIG. 3.

The method 1000 may further include determining whether the averaging counter count value is greater than greater than a maximum value XMAX, at 1016. If the averaging counter count value is greater than XMAX, the method 1000 may further include decreasing the fine delay applied to the RCLK signal, at 1017. If the averaging counter count value is not greater than XMAX, the method 1000 may further include determining whether the averaging counter is greater than less than a minimum value XMIN, at 1018. If the averaging counter count value is less than XMIN, the method 1000 may further include increasing the fine delay applied to the RCLK signal, at 1019. After the fine delay is decreased, at 1017, or increased, at 1019, the method 1000 may further include resetting the averaging counter, at 1020. After the averaging counter is reset, at 1020, or when the averaging counter count value is not greater than the XMAX, at 1016, and not less than XMIN, at 1018, the method 1000 may further include selecting another core die, at 1012 and repeating steps 1013-1020. Rather than adjusting the fine delay, as described with reference to the method 800 of FIG. 8, the method 1000 describes only adjusting the fine delay when a count value falls outside the XMIN to XMAX boundary values. This may result in less frequent adjustments of the fine delay value due to small variations from sample to sample.

Figure 11:
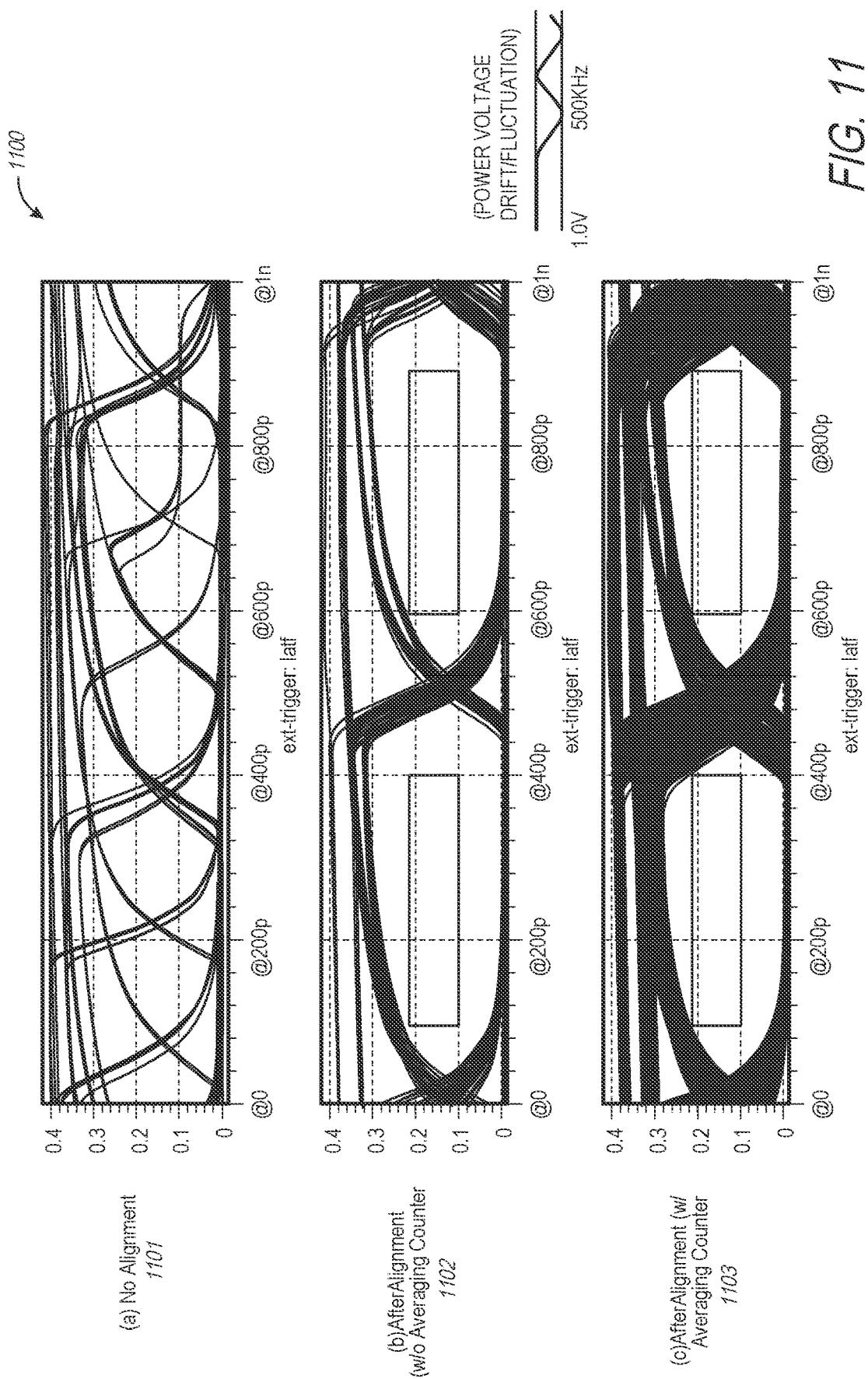
FIG. 11 includes exemplary diagrams of read data eye graphs in accordance with embodiments of the disclosure.

FIG. 11 includes an exemplary diagrams 1100 of read data eye graphs in accordance with embodiments of the disclosure. The first read data eye graph 1101 depicts an exemplary operation of a stacked memory device when no read data align operation is performed. The second read data eye graph 1102 depicts an exemplary operation of a stacked memory device when a read data align operation without an averaging counter (e.g., using devices and methods described with reference to FIGS. 1-9) is performed. The third read data eye graph 1103 depicts an exemplary operation of a stacked memory device when a read data align operation with an averaging counter (e.g., using devices and methods described with reference to FIGS. 1-7 and 10A-B) is performed. As shown in the second read data graph 1102 and the third read data graph 1103, the read data windows are much larger than the read data windows depicted in the first read data graph 1101. The exemplary diagrams 1100 depicted in FIG. 11 are examples. Actual implantations may vary from the timing depicted in the exemplary diagrams 1 stacked memory device 100 of FIG. 11 without departing from the scope of the disclosure.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
 a first die comprising a first replica align circuit, wherein the first replica align circuit includes first variable delay circuitry; and
 a second die coupled to the first die and comprising a second replica align circuit, wherein the second replica align circuit includes second variable delay circuitry;
 a first conductive path between the first die and the second die configured to provide read data from the second die; and
 a second conductive path between the first die and the second die configured to perform a read data align operation, wherein the second conductive path includes the first replica align circuit and the second replica align circuit, and wherein the second conductive path comprises a replica path configured to simulate a propagation delay of the first conductive path,
 wherein, during a read data align operation, the first variable delay circuitry is set to apply a first delay to respective received signals based on a first propagation delay through the first replica align circuit, wherein, in response to the first variable delay circuitry being set to apply the first delay, the second variable delay circuitry is set to apply a second delay to the respective received signals based on a comparison between a second propagation delay through the second replica align circuit and the first propagation delay.

2. The apparatus of claim 1, wherein the first die and the second die are vertically-stacked.

3. The apparatus of claim 1, wherein the first die includes a phase detector configured to compare timing of the respective received signal through the first replica align circuit with timing of the respective received signal through the second replica align circuit to adjust the second delay applied by the second replica align circuit.

4. The apparatus of claim 1, further comprising a third die configured to including a third replica align circuit coupled to the second conductive path, wherein, during the read data align operation, after the first align circuit and the first replica align circuit are set to apply the first delay to the respective received signals, the third die is configured to apply a third delay to the respective signals through the third replica align circuit based on a comparison between a third propagation delay through the third replica align circuit and the first propagation delay.

5. The apparatus of claim 4, wherein the third die includes a third control circuit, and during a normal operation, the third control circuit is configured to adjust a value of the third delay based on a phase difference between the received signals propagated through the third replica align circuit and the received signals propagated through the first replica align circuit.

6. The apparatus of claim 1, wherein the second die includes a second control circuit, and during a normal operation, the second control circuit is configured to adjust a value of the second delay based on a phase difference between the received signals propagated through the second replica align circuit and the received signals propagated through the first replica align circuit.

7. The apparatus of claim 6, wherein the second control circuit is configured to increase a coarse delay value of the second delay until the propagation delay of the received signals propagated through the second replica align circuit is greater than the propagation delay of the received signals through the first replica align circuit to set the value of the second delay.

8. The apparatus of claim 7, wherein the second control circuit is further configured to adjust a fine delay value of the second delay until the propagation delay of the clock signal propagated through the second replica align circuit is equal to the propagation delay of the clock signal through the first replica align circuit to set the value of the second delay.

9. The apparatus of claim 8, wherein the second control circuit is further configured to adjust the fine delay value until the propagation delay of the received signals propagated through the second replica align circuit is equal to the propagation delay of the received signals through the first replica align circuit when an averaging counter count value is greater than a maximum value or less than a minimum value.

10. The apparatus of claim 1, wherein the first die includes a first control circuit, and during the read data align operation, the first control circuit is configured to increase the first delay value of the first replica align circuit until the propagation delay of the clock signal through the first replica align circuit is greater than the propagation delay of the clock signal through the second replica align circuit.

11. A method comprising:
    during a read data align operation:
    adjusting a first delay through a first replica align circuit of a first die until a propagation delay of a clock signal through a second replica align circuit of a second die coupled to the first die is less than a propagation delay of the clock signal through the first replica align circuit; and
    in response to the propagation delay of the clock signal through the second replica align circuit of the second die being less than the propagation delay of the clock signal through the first replica align circuit, setting a second delay through the second replica align circuit that results in the propagation delay of the clock signal through the second replica align circuit being equal to the propagation delay of the clock signal through the first replica align circuit, wherein the read data align operation is performed via a replica conductive path between the first die and the second die, wherein the replica conductive path includes the first replica align circuit and the second replica align circuit and wherein the replica conductive path is configured to simulate a propagation delay of a native conductive path between the first die and the second die, the native conductive path being configured to provide read data from the second die.

12. The method of claim 11, further comprising, during the read data align operation, comparing determining a phase difference between the clock signal propagated through the first replica circuit and the clock signal propagated through the second replica circuit to determine the first delay and the second delay.

13. The method of claim 11, further comprising, during the read data align operation, adjusting a third delay associated with a third replica align circuit of a third die until a propagation delay of the clock signal through the third replica align circuit is equal to the propagation delay of the clock signal through the first replica align circuit.

14. The method of claim 13, further comprising, during the read data align operation, adjusting the first delay through the first align circuit and the first replica align circuit until the propagation delay of the clock signal through the third replica align circuit is less than the propagation delay of the clock signal through the first replica align circuit to adjust the third delay.

15. The method of claim 14, further comprising, further in response to the first delay being set to the value that results in the propagation delay of the clock signal through the second replica align circuit of the second die being less than the propagation delay of the clock signal through the first replica align circuit, setting the third delay through the third replica align circuit that results in the propagation delay of the clock signal through the third replica align circuit being equal to the propagation delay of the clock signal through the first replica align circuit.

16. The method of claim 11, further comprising increasing a coarse delay value of the second delay until the propagation delay of the clock signal propagated through the second replica align circuit is greater than the propagation delay of the clock signal through the first replica align circuit to set the second delay through the second replica align circuit.

17. The method of claim 16, further comprising adjusting a fine delay value of the second delay until the propagation delay of the clock signal propagated through the second replica align circuit is equal to the propagation delay of the clock signal through the first replica align circuit to set the second delay through the second replica align circuit.

18. The method of claim 17, further comprising adjusting the fine delay value of the second delay value is in response to an averaging counter count value being greater than a maximum value.

19. The method of claim 17, further comprising adjusting the fine delay value of the second delay value is in response to an averaging counter count value being less than a minimum value.

20. The method of claim 11, wherein the first die and the second die are stacked.

* * * * *